United States Patent
Sauter et al.

(10) Patent No.: US 10,748,852 B1
(45) Date of Patent: Aug. 18, 2020

(54) MULTI-CHIP MODULE (MCM) WITH CHIP-TO-CHIP CONNECTION REDUNDANCY AND METHOD

(71) Applicant: MARVELL INTERNATIONAL LTD., Hamilton (BM)

(72) Inventors: Wolfgang Sauter, Burke, VT (US); Mark W. Kuemerle, Essex Junction, VT (US); Edmund Blackshear, Wappingers Falls, NY (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/663,413

(22) Filed: Oct. 25, 2019

(51) Int. Cl.
| | |
|---|---|
| *H01L 23/525* | (2006.01) |
| *H01L 23/538* | (2006.01) |
| *H01L 25/065* | (2006.01) |
| *H01L 23/00* | (2006.01) |
| *H01L 21/66* | (2006.01) |

(52) U.S. Cl.
CPC .......... *H01L 23/5382* (2013.01); *H01L 22/22* (2013.01); *H01L 23/5252* (2013.01); *H01L 23/5256* (2013.01); *H01L 24/48* (2013.01); *H01L 25/0655* (2013.01); *H01L 2224/48137* (2013.01)

(58) Field of Classification Search
CPC . H01L 22/22; H01L 23/5252; H01L 23/5256; H01L 23/5382; H01L 24/48; H01L 25/0655; H01L 2224/48137
USPC ........................................ 327/526, 564, 565
See application file for complete search history.

(56) References Cited

U.S. PATENT DOCUMENTS

| | | |
|---|---|---|
| 5,808,351 A | 9/1998 | Nathan et al. |
| 6,281,590 B1 | 8/2001 | Gabara et al. |
| 6,301,121 B1 | 10/2001 | Lin |

(Continued)

FOREIGN PATENT DOCUMENTS

EP 3104277 B1 11/2017

OTHER PUBLICATIONS

Troy Beukema, "Topics in Design and Analysis of High Data Rate SERDES Systems", IEEE SSCS, Denver Section Seminar, 2009, pp. 1-95.

*Primary Examiner* — William Hernandez

(57) ABSTRACT

Disclosed is a multi-chip module (MCM) with redundant chip-to-chip communication connection(s) to minimize the need to discard a chip-mounting layer due to defective signal traces. The MCM includes at least first and second chips mounted on the chip-mounting layer. The chip-mounting layer includes signal traces that are electrically connected between first and second links on the first and second chips, respectively, to form communication connections including at least one redundant communication connection. Instead of being directly connected to the chip-to-chip communication connections, first and second interfaces on the first and second chips are connected via first and second multiplexors, respectively, to selected ones of multiple chip-to-chip communication connections. By employing the multiplexors and the redundant chip-to-chip communication connection(s), chip-to-chip communication connection(s) with defective signal trace(s) can be bypassed. Specifically, during MCM assembly, the multiplexors are programmed to avoid using chip-to-chip communication connections with defective signal traces.

20 Claims, 7 Drawing Sheets

(56) References Cited

U.S. PATENT DOCUMENTS

| | | | | |
|---|---|---|---|---|
| 8,933,447 B1* | 1/2015 | Rahman | ......... | G01R 31/318513 257/48 |
| 2010/0060310 A1* | 3/2010 | Laisne | ................ | H01L 25/0657 326/10 |
| 2013/0009694 A1* | 1/2013 | Camarota | ............... | H01L 22/22 327/526 |
| 2013/0127028 A1* | 5/2013 | Morimoto | ........... | H01L 27/0688 257/666 |
| 2015/0185274 A1* | 7/2015 | Hwang | .......... | G01R 31/318513 324/750.3 |
| 2016/0012865 A1* | 1/2016 | Lee | .................. | G11C 29/50008 365/51 |
| 2016/0043029 A1* | 2/2016 | Shikibu | .............. | G01R 31/2853 324/762.01 |
| 2016/0154049 A1* | 6/2016 | Oshiyama | ............... | H01L 22/32 324/762.01 |
| 2016/0363626 A1* | 12/2016 | How | .................... | G06F 11/1625 |
| 2018/0096979 A1* | 4/2018 | Pappu | .................... | H01L 22/32 |
| 2019/0158096 A1* | 5/2019 | Tang | .................. | H01L 23/5381 |

* cited by examiner

US 10,748,852 B1

MULTI-CHIP MODULE (MCM) WITH CHIP-TO-CHIP CONNECTION REDUNDANCY AND METHOD

BACKGROUND

Field of the Invention

The present invention relates to substrate yield for multi-chip modules (MCMs) and, more particularly, to embodiments of a MCM and a method of designing, manufacturing and assembling the MCM so as to optimize yield.

Description of Related Art

Chip modules (also referred to herein as chip packages) include one chip (in the case of a single chip module (SCM) and multiple chips (in the case of a multi-chip module (MCM)) mounted on a substrate. Although device scalability is often a factor in chip design, future generations of multi-chip modules (MCMs) that are designed for high-speed communication applications (e.g., wired networking applications) are expected to be larger in size in order to accommodate the added components required to meet faster off-module bandwidth demands. Specifically, in order to meet the faster off-module bandwidth demands, future generation MCMs will require more on-chip serializer/deserializer (ser/des) functional blocks, thereby increasing chip size. They will also require more on-substrate ball grid arrays (BGAs) (e.g., four BGAs for signal processing for each ser/des lane plus additional BGAs for isolation), thereby increasing the substrate size. Unfortunately, recent data reveals that as the size of the MCM substrate increases (e.g., to 5625 mm$^2$ and beyond) the cost increases exponentially. Thus, forming such large MCMs may be cost-prohibitive particularly when yield loss due to defects in the substrate are taken into account.

SUMMARY

Disclosed herein are embodiments of a multi-chip module (MCM). This MCM can include a chip-mounting layer. The chip-mounting layer could be, for example, the module substrate. Alternatively, the chip-mounting layer could be an interposer mounted on the module substrate. In any case, the chip-mounting layer can include signal traces that run between chip-mounting areas.

The MCM can further include at least two chips (i.e., at least a first chip and a second chip) mounted on a surface of the chip-mounting layer (i.e., within the chip-mounting areas). The first chip can include first links and the second chip can include second links, which are paired with the first links. That is, the MCM can include pairs of first and second links. Each signal trace can be electrically connected to a first link on the first chip and to a corresponding second link on the second chip (i.e., to a given pair of first and second links), thereby forming a chip-to-chip communication connection. Thus, the MCM will have multiple chip-to-chip communication connections. The first chip can further include first interfaces and the second chip can further include second interfaces, which are paired with the first interfaces. That is, the MCM can include pairs of first and second interfaces. The first chips can further include first multiplexors, where each first multiplexor is connected between one first interface and multiple first links. The second chip can further include second multiplexors, where each second multiplexor is connected between one second interface and multiple second links. Thus, each pair of first and second interfaces is selectively connectable by a corresponding pair of first and second multiplexors to one of multiple chip-to-chip communication connections.

As mentioned above, yield loss is anticipated to be particularly costly in MCMs for high-speed communication applications, where the module substrate and at least one of the chips on the module substrate are relatively large. Thus, one exemplary embodiment disclosed herein specifically addresses yield loss associated with such MCMs. That is, one exemplary embodiment of an MCM disclosed herein can include a module substrate and the module substrate can include signal traces that run between chip-mounting areas. The module substrate can be relatively large. Specifically, the size of the module substrate can be at or above 5625 mm$^2$.

The MCM can further include multiple chips mounted on a surface of the chip-mounting layer in the chip-mounting areas. The chips can include at least a first chip and a second chip and a size of at least one of the chips can be relatively large. Specifically, the size of at least one of the chips can be at or above 400 mm$^2$. In any case, the first chip can include first links and the second chip can include second links, which are paired with the first links. That is, the MCM can include pairs of first and second links. Each signal trace can be electrically connected to a first link on the first chip and to a corresponding second link on the second chip (i.e., to a given pair of first and second links), thereby forming a chip-to-chip communication connection. Thus, the MCM will have multiple chip-to-chip communication connections. The first chip can further include first interfaces (e.g., first serializer/deserializer (ser/des) functional blocks) and the second chip can further include second interfaces (e.g., second ser/des functional blocks), which are paired with the first interfaces. That is, the MCM can also include pairs of first and second interfaces. The first chips can further include first multiplexors, where each first multiplexor is connected between one first interface and multiple first links. The second chip can further include second multiplexors, where each second multiplexor is connected between one second interface and multiple second links. Thus, each pair of first and second interfaces is selectively connectable by a corresponding pair of first and second multiplexors to one of multiple chip-to-chip communication connections.

Also disclosed herein are method embodiments for designing, manufacturing and assembling the above-described multi-chip modules (MCMs). Specifically, the method can include mounting multiple chips, including at least a first chip and a second chip, on a surface of a chip-mounting layer in designated chip-mounting areas. The chip-mounting layer could be, for example, the module substrate. Alternatively, the chip-mounting layer could be an interposer designed to be mounted onto the module substrate such that, in the final MCM structure, the interposer will be stacked between the module substrate and the chips. In any case, the chip-mounting layer can include signal traces that run between the designated chip-mounting areas. The first chip can include first interfaces, first links, and first multiplexors and each first multiplexor can be connected between one first interface and multiple first links. The second chip can include second interfaces, second links, and second multiplexors and each second multiplexor can be connected between one second interface and multiple second links. During the process step of mounting the chips onto the chip-mounting layer, each signal trace can be electrically connected to a first link on the first chip and to a second link on the second chip to form chip-to-chip communication connections. The method can further include using each pair of first and second multiplexors to connect a corresponding pair of first and second interfaces to a selected one of at least two of the chip-to-chip communication connections.

It should be noted that in the structure and method embodiments disclosed herein the number of communication connections can be greater by at least one than the number of pairs of first and second interfaces such that at least one of the communication connections is considered redundant (referred to herein as a redundant communication connection). That is, the redundant communication connection is an extra communication connection. By employing on-chip multiplexors and the redundant chip-to-chip communication connection(s), chip-to-chip communication connection(s) with defective signal trace(s) can be bypassed. Specifically, during MCM assembly, the on-chip multiplexors can be programmed to avoid using chip-to-chip communication connections with defective signal traces. Thus, not all chip-mounting layers with defective signal traces need to be discarded and yield can be effectively improved.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, although device scalability is often a factor in chip design, future generations of multi-chip modules (MCMs) that are designed for high-speed communication applications (e.g., wired networking applications) are expected to be larger in size in order to accommodate the added components required to meet faster off-module bandwidth demands. More specifically, chip modules that are currently used in wired networking applications typically include a single chip, which is approximately 400 mm$^2$ in size and which is mounted on a module substrate that is approximately 3600 mm$^2$. Such single chip modules (SCM) can, for example, achieve an off-module bandwidth of 12.8 terabytes/second (Tbps). However, next generation chip modules are expected to achieve an off-module bandwidth of 25 Tbps or faster and next-next generation chip modules are expected to achieve an off-module bandwidth of 50 Tbps or faster.

To meet these faster off-module bandwidth demands in future generation chip modules, multiple chips (i.e., multi-chip modules (MCM)) are expected to be used. Additionally, the number of on-chip serializer/deserializer (ser/des) functional blocks is expected to increase and the chip size must be increased to accommodate the additional ser/des functional blocks. Furthermore, increasing the number of ser/des functional blocks per chip will require a significant increase in the number of ball grid arrays (BGAs) on the module substrate for both signal processing and isolation. For example, each additional ser/des lane may require an additional four on-substrate BGAs for signal process plus some additional BGAs for isolation. Thus, the substrate size must also be increased to accommodate the additional BGAs. An exemplary next generation multi-chip module (MCM) may include a pair of chips that are approximately 500 mm$^2$ in size mounted on a module substrate that is approximately 7225 mm$^2$. An exemplary next next generation multi-chip module (MCM) may include one large chip that is approximate 650 mm$^2$ in size surrounded by multiple (e.g., eight) smaller chips (referred to herein as chiplets) and all mounted on a module substrate that is approximately 11,025 mm$^2$. Unfortunately, recent data reveals that as the size of the MCM substrate increases (e.g., to 5625 mm$^2$ and beyond) the cost increases exponentially. Thus, forming such large MCMs may be cost-prohibitive particularly when yield loss due to defects in the substrate are taken into account.

Figure 1:
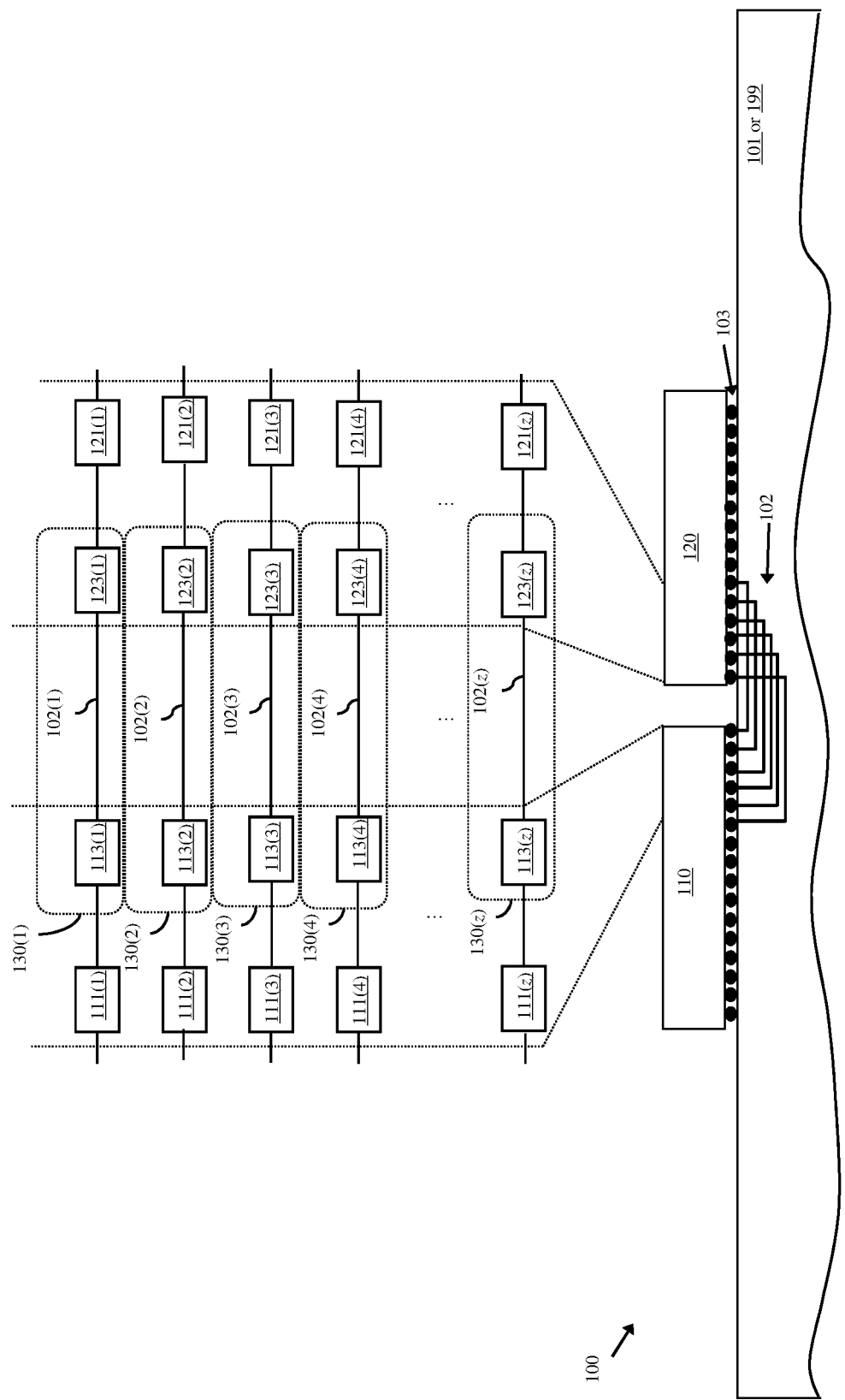
FIG. 1 is a schematic diagram illustrating a conventional multi-chip module (MCM) architecture.

For example, FIG. 1 is a schematic drawing illustrating a conventional MCM 100. This MCM 100 includes a chip-mounting layer and multiple chips (e.g., a first chip 110 and a second chip 120) mounted thereon (e.g., by C4-connections 103, also referred to as controlled collapse chip connections) in chip-mounting areas.

For purposes of this disclosure, "a chip-mounting layer" refers to a layer in the MCM on which chips are mounted (e.g., by C4 connections) in designated areas according to the MCM design (referred to herein as chip-mounting areas). The chip-mounting layer could be, for example, the module substrate 101. Alternatively, the chip-mounting layer could be an interposer 199, which is mounted on the module substrate and, thus, stacked between the chips and the module substrate.

In any case, the chip-mounting layer could include signal traces 102(1)-102(z) (i.e., signal wires) that run between the chip-mounting areas. The first chip 110 can include first links 113(1)-113(z) and the second chip 120 can include second links 123(1)-123(z) and, which are paired with the first links. That is, the MCM can include pairs of first and second links. Each signal trace 102(1)-102(z) can be electrically connected to a first link on the first chip and to a corresponding second link on the second chip (i.e., to a given pair of first and second links), thereby forming a chip-to-chip communication connection. Thus, the MCM will have multiple chip-to-chip communication connections 130(1)-130(z). The first chip 110 can further include first interfaces 111(1)-111(z) connected to the first links 113(1)-113(z), respectively, and the second chip 120 can further include second interfaces 121(1)-121(z), which are paired with the first interfaces and connected to the second links 123(1)-123(z), respectively. That is, the MCM can include pairs of first and second interfaces and the first and second interfaces of each pair are connected to a corresponding chip-to-chip communication connection. Thus, if defective signal traces are identified during or after chip-mounting layer manufacture, then the chip-mounting layer must be discarded. As mentioned above, recent data indicates that future generation MCMs for high-speed communication applications will require large module substrates and that the costs of these module substrates increases exponentially as the size moves above 5625 mm$^2$. Thus, losses due to defective signal traces within the module substrates will be particularly costly in these future generation MCMs.

In view of the foregoing, disclosed herein are embodiments of a multi-chip module (MCM) that includes one or more redundant chip-to-chip communication connections. Specifically, the MCM can include at least first and second chips mounted on a chip-mounting layer. The chip-mounting layer can include signal traces that are electrically connected between first and second links on the first and second chips, respectively, to form chip-to-chip communication connections (including at least one redundant chip-to-chip connection). Instead of being directly connected to the chip-to-chip communication connections, first and second interfaces on the first and second chips can be connected via first and second multiplexors, respectively, to selected ones of multiple chip-to-chip communication connections. By employing the multiplexors and the redundant chip-to-chip communication connection(s), chip-to-chip communication connection(s) with defective signal trace(s) can be bypassed. Specifically, during MCM assembly, the on-chip multiplexors can be programmed (i.e., can receive control signals) to avoid using chip-to-chip communication connections with defective signal traces. Thus, chip-mounting layers that include defective signal traces can still be employed (i.e., not discarded) during MCM assembly, thereby improving yield.

Figure 2:
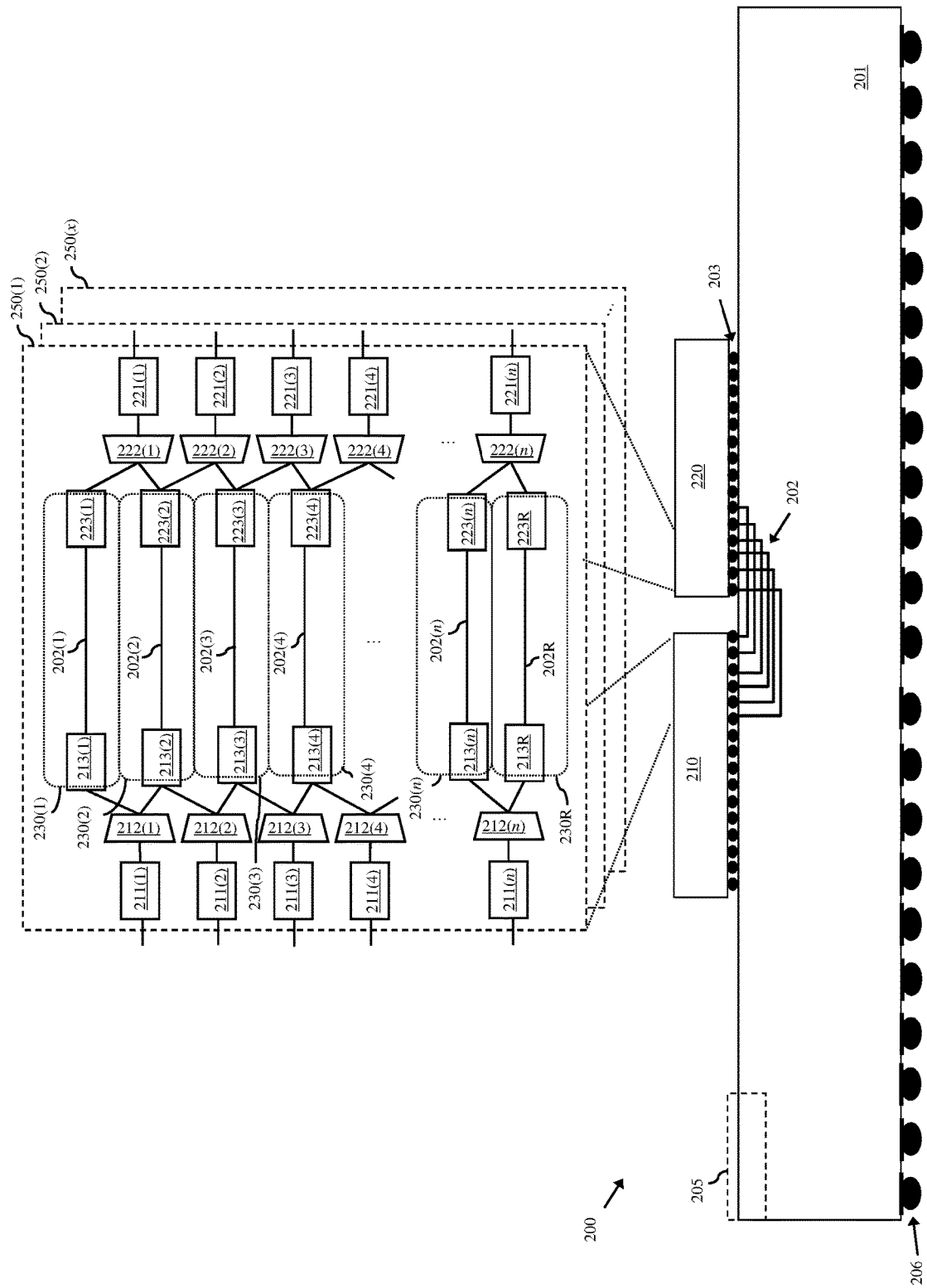
FIG. 2 is a schematic diagram illustrating a disclosed embodiment of an MCM configured to optimize yield.
Figure 3:
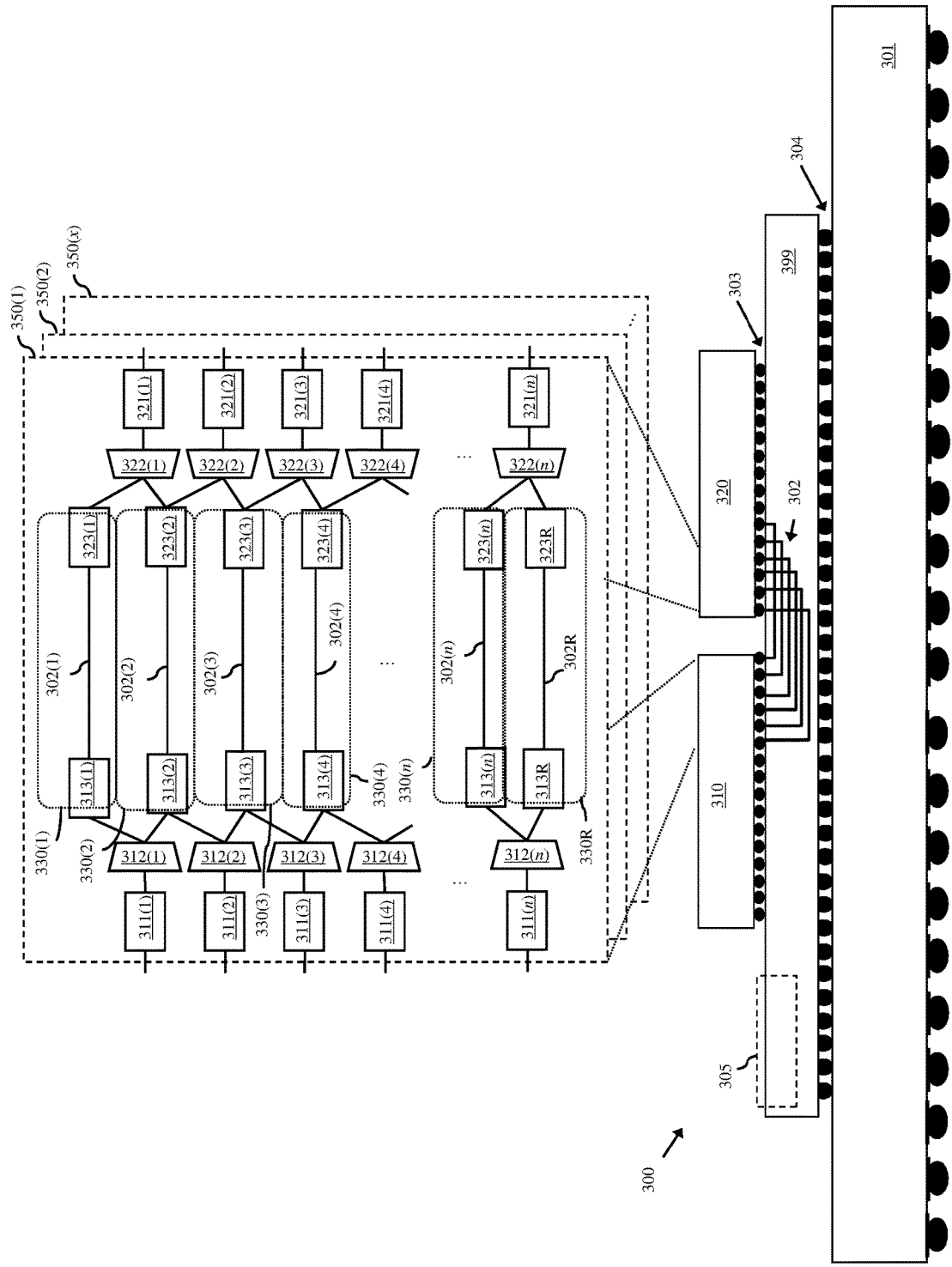
FIG. 3 is a schematic diagram illustrating another disclosed embodiment of an MCM configured to optimize yield.

More particularly, referring to FIGS. 2 and 3, disclosed herein are embodiments of a multi-chip module (MCM) 200, 300 (also referred to herein as a multi-chip package). This MCM 200, 300 can include a chip-mounting layer 201, 399. The chip-mounting layer 201, 399 can include a first surface and a second surface opposite the first surface. The second surface of the chip-mounting layer can include chip-mounting areas and the MCM 200, 300 can further include at least two chips (i.e., at least a first chip 210, 310 and a second chip 220, 320) mounted on the second surface of the chip-mounting layer 201, 399 in the chip-mounting areas. The chips 210-220 and 310-320 can be mounted onto the second surface of the chip-mounting layer 201, 399 using, for example, C4 connections 203, 303.

The chip-mounting layer could be the module substrate 201 (also referred to herein as the package substrate) (e.g., see the embodiment of the MCM 200 shown in FIG. 2). That is, as illustrated in FIG. 2, the first and second chips 210 and 220 could be mounted directly onto the module substrate 201. Those skilled in the art will recognize that the module substrate provides mechanical strength to the MCM. The module substrate 201 could be, for example, a laminate substrate (i.e., a module substrate with multiple layers to provide rigidity) or any other suitable module substrate. The module substrate 201 can also include ball grid arrays (BGAs) 206 on the first surface opposite the first and second chips 210 and 220. Those skilled in the art will recognize that BGAs enable mounting of the module substrate onto a printed circuit board (PCB) and further provide the electrical connections between the module substrate and the PCB (e.g., for power supply, signal transmission, etc.) as well as isolation around those electrical connections. A module substrate also typically includes vias and wires (e.g., power traces, signal traces, etc.) routed to provide both chip-to-chip electrical connections and chip-to-PCB electrical connections.

Alternatively, the chip-mounting layer could be an interposer 399 mounted on the module substrate 301 (e.g., by additional C4 connections 304) such that the interposer 399 is stacked between the module substrate 301 and the first and second chips 310 and 320. The interposer 399 can include vias and wiring (e.g., power traces, signal traces, etc.) to provide chip-to-chip electrical connections and chip-to-module substrate electrical connections.

In any case, the MCM 200, 300 can include some number (x) of chip-to-chip communication section(s) 250(1)-250(x), 350(1)-350(x). For purposes of illustration, three chip-to-chip communication sections are shown in the Figures. Alternatively, the number (x) of chip-to-chip communication sections could be one, two, four or more chip-to-chip communication sections.

Each chip-to-chip communication section 250(1)-250(x), 350(1)-350(x) can have: first links 213, 313 (e.g., input/output ports) on the first chip 210, 310; second links 223, 323 (e.g., input/output ports) on the second chip 220, 320; and signal traces 202, 302 in the chip-mounting layer 201, 399 and electrically connecting the first links 213, 313 to the second links 223. 323 to create chip-to-chip communication connections. Specifically, each chip-to-chip communication section 250(1)-250(x), 350(1)-350(x) can include, on the first chip 210, 310, some number (n) of first links 213(1)-213(n), 313(1)-313(n) plus one redundant first link 213R, 313R. Each chip-to-chip communication section 250(1)-250(x), 350(1)-350(x) can further include, on the second chip 220, 320, the same number (n) of second links 223(1)-223(n), 323(1)-323(n) plus one redundant second link 223R, 323R. It should be noted that in each section the first links (including the redundant first link) on the first chip can be paired with the second links (including the redundant second link) on the second chip. For example, in each set, the pairs of first and second links include: first link 213(1), 313(1) and second link 223(1), 323(1); first link 213(2), 313(2) and second link 223(2), 323(2); and so on; including redundant first link 213R, 313R and redundant second link 223R, 323R.

Each chip-to-chip communication section 250(1)-250(x), 350(1)-350(x) can further include signal traces, which are in the chip-mounting layer 201, 399 and which connect the pairs of first and second links on the first and second chips, respectively. That is, each chip-to-chip communication section can have n signal traces 202(1)-202(n), 302(1)-302(n), which connect the n first links 213(1)-213(n), 313(1)-313(n) on the first chip 210, 310 to the corresponding n second links 223(1)-223(n), 323(1)-323(n) on the second chip 220, 320. Each chip-to-chip communication section can also include one redundant signal trace 202R, 302R, which connects the redundant first link 213R, 313R to the redundant second link 223R, 323R. Thus, in each section, there are n chip-to-chip communication connections 230(1)-230(n), 330(1)-330(n) plus one redundant chip-to-chip communication 230R, 330R. In other words, the MCM 200, 300 has one redundant chip-to-chip communication connection 230R, 330R (i.e., one extra chip-to-chip communication connection) for every n chip-to-chip communication connections.

For example, for a given design, an MCM may require 500 chip-to-chip communication connections. For this given design, one exemplary MCM structure could include only one chip-to-chip communication section (i.e., x=1) with 500 chip-to-chip communication connections (i.e., n=500) plus one redundant chip-to-chip communication connection. For this design, another exemplary MCM structure could include five chip-to-chip communication sections (i.e., x=5) and each section could include 100 chip-to-chip communication connections (i.e., n=100) plus one redundant chip-to-chip communication connections. For this design, yet another exemplary MCM structure could include five chip-to-chip communication sections (i.e., x=10) and each section could include 50 chip-to-chip communication connections (i.e., n=50) plus one redundant chip-to-chip communication connections; and so on. Thus, MCM designs with more sections and fewer chip-to-chip communication connections per section will provide more redundancy.

Each chip-to-chip communication section 250(1)-250(x), 350(1)-350(x) can further include n first interfaces 211(1)-211(n), 311(1)-311(n), which are on the first chip 210, 310, and n second interfaces 221(1)-221(n), 321(1)-321(n), which are on the second chip 220, 320 and which are paired per the MCM design with the first interfaces 211(1)-211(n), 311(1)-311(n). That is, each chip-to-chip communication section 250(1)-250(x), 350(1)-350(x) can include n pairs of first and second interfaces. The first interfaces 211(1)-211(n), 311(1)-311(n) and the second interfaces 221(1)-221(n), 321(1)-321(n) can be, for example, serial/deserializer (ser/des) functional blocks. Alternatively, the first interfaces 211(1)-211(n), 311(1)-311(n) and the second interfaces 221(1)-221(n), 321(1)-321(n) could be any other suitable communication interface.

Each chip-to-chip communication section 250(1)-250(x), 350(1)-350(x) can further include n first multiplexors 212(1)-212(n), 312(1)-312(n), which are on the first chip 210, 310, and n second multiplexors 222(1)-222(n), 322(1)-322(n), which are on the second chip 220, 320 and which are paired per the MCM design with the first multiplexors 212(1)-212(n), 312(1)-312(n). Each first multiplexor 212(1)-212(n), 312(1)-312(n) on the first chip 210, 310 can be connected between one first interface 211(1)-211(n), 311(1)-311(n) and multiple first links (e.g., two of the first links including a primary first link and a secondary first link for that interface). For example, as illustrated, the first multiplexor 212(1), 312(1) can be connected between the first first interface 211(1), 311(1) in the section and both the primary first link 213(1), 313(1) and the secondary first link 213(2), 313(2) for the first interface 211(1), 311(1); the first multiplexor 212(2), 312(2) can be connected between the first interface 211(2), 311(2) and both the primary first link 213(2), 313(2) and the secondary first link 213(3), 313(3) for the first interface 211(2), 311(2); and so on, with the last first multiplexor 212(n), 312(n) in the section being connected between the last first interface 211(n), 311(n) and both the primary first link 213(n), 313(n) and the redundant first link 213R, 313R. Similarly, each second multiplexor 222(1)-222(n), 322(1)-322(n) on the second chip 220, 320 can be connected between one second interface 221(1)-221(n), 321(1)-321(n) and multiple second links (e.g., two of the second links including a primary second link and a secondary second link for that interface). For example, as illustrated, the first second multiplexor 222(1), 322(1) in the section can be connected between the second interface 221(1), 321(1) and both the primary second link 223(1), 323(1) and the secondary second link 223(2), 323(2) for the second interface 221(1), 321(1); the second multiplexor 222(2), 322(2) can be connected between the second interface 221(2), 321(2) and both the primary second link 223(2), 323(2) and the secondary second link 223(3), 323(3) for the second interface 221(2), 321(2); and so on, with the last second multiplexor 222(n), 322(n) in the section being connected between the last second interface 221(n), 321(n) and both the primary second link 223(n), 323(n) and the redundant second link 223R, 323R.

Thus, in a given chip-to-chip communication section, each pair of first and second interfaces is selectively connectable by a corresponding pair of first and second multiplexors to one of multiple chip-to-chip communication connections. That is, the first pair of first and second interfaces 211(1) and 221(1), 311(1) and 321(1) are selectively connectable by the first pair of first and second multiplexors 212(1) and 222(1), 312(1) and 322(1) to either the first chip-to-chip communication connection 230(1), 330(1) or the second chip-to-chip communication connection 230(2), 330(2); the second pair of first and second interfaces 211(2) and 221(2), 311(2) and 321(2) are selectively connectable by the second pair of first and second multiplexors 212(2) and 222(2), 312(2) and 322(2) to either the second chip-to-chip communication connection 230(2), 330(2) or the third chip-to-chip communication connection 230(3), 330(3); and so on with the last pair of first and second interfaces 211(n) and 221(n), 311(n) and 321(n) being selectively connectable by the last pair of first and second multiplexors 212(n) and 222(n), 312(n) and 322(n) to either the chip-to-chip communication connection 230(n), 330(n) or the redundant chip-to-chip communication connection 230R, 330R (i.e., the extra chip-to-chip communication connection).

By employing the multiplexors and the redundant chip-to-chip communication connection(s), chip-to-chip communication connection(s) with defective signal trace(s) that are detected within the chip-mounting layer 201, 399 can be bypassed.

Specifically, during MCM assembly, the on-chip multiplexors can be programmed to avoid using chip-to-chip communication connections with defective signal traces. That is, since each pair of first and second interfaces is selectively connectable by a corresponding pair of first and second multiplexors to one of two chip-to-chip communication connections for that pair of first and second interfaces, then if one of the two chip-to-chip communication connections is known to have a defective signal trace, then pair of first and second interfaces could be selectively connected by the pair of first and second multiplexors to the other one of the two chip-to-chip communication connections.

Figure 4:
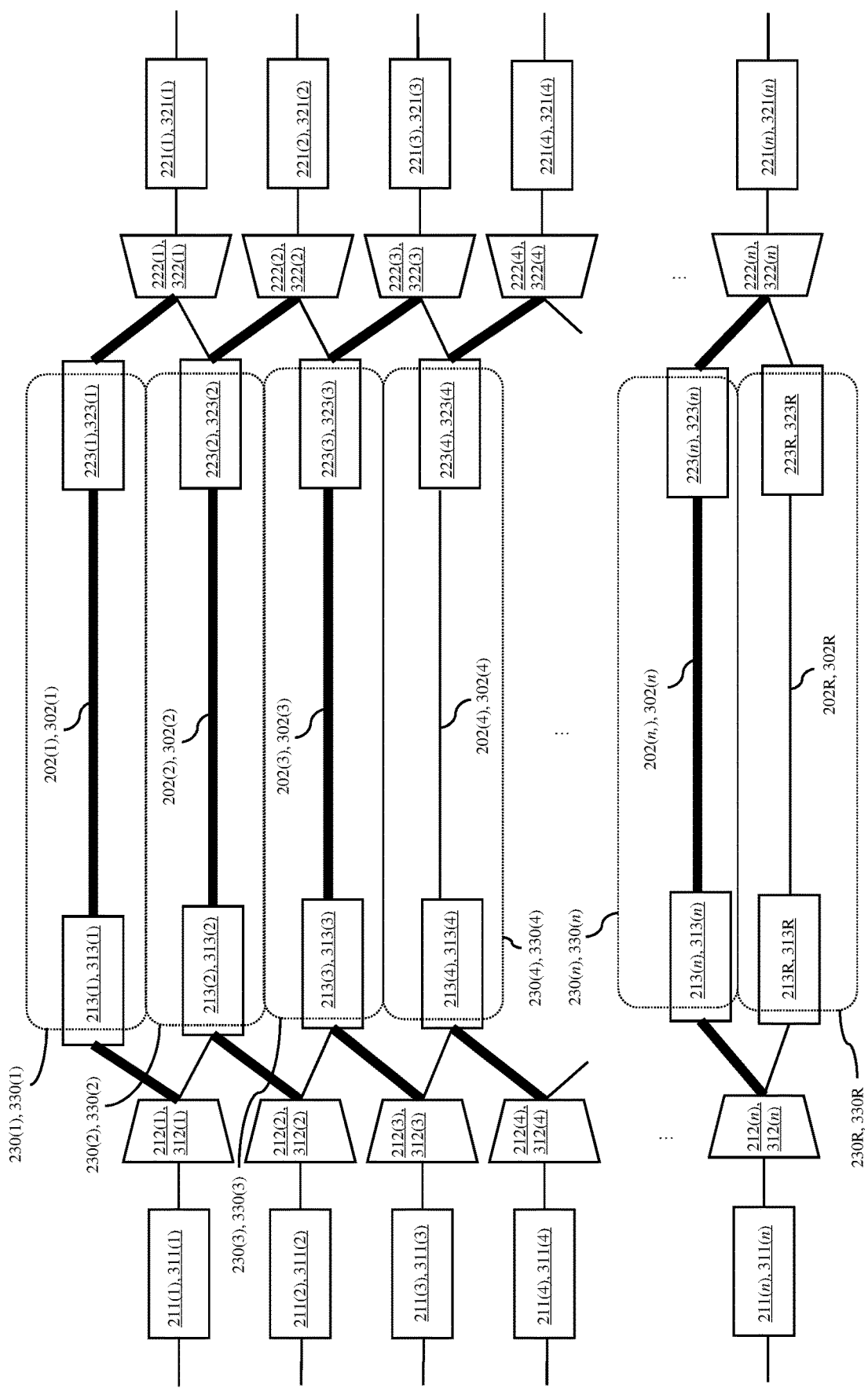
FIGS. 4-6 are schematic diagrams illustrating alternative selective electrical connections that could be made within the disclosed MCM embodiments in order to bypass defective signal traces in the chip-mounting layer, as necessary.

For example, consider the case as shown in FIG. 4, none of the signal traces in any of the chip-to-chip communication connections 230(1)-230(n) and 230R, 330(1)-330(n) and 330R is found to be defective. In this case, during MCM assembly, control signals will be sent to the first multiplexors 212(1)-212(n), 312(1)-312(n) and to the second multiplexors 222(1)-222(n), 322(1)-322(n) so that the pairs of first and second interfaces are connected to their primary chip-to-chip communication connections 230(1)-230(n), 330(1)-330(n), respectively, and the redundant chip-to-chip communication connection 230R, 330R will go unused.

Figure 5:
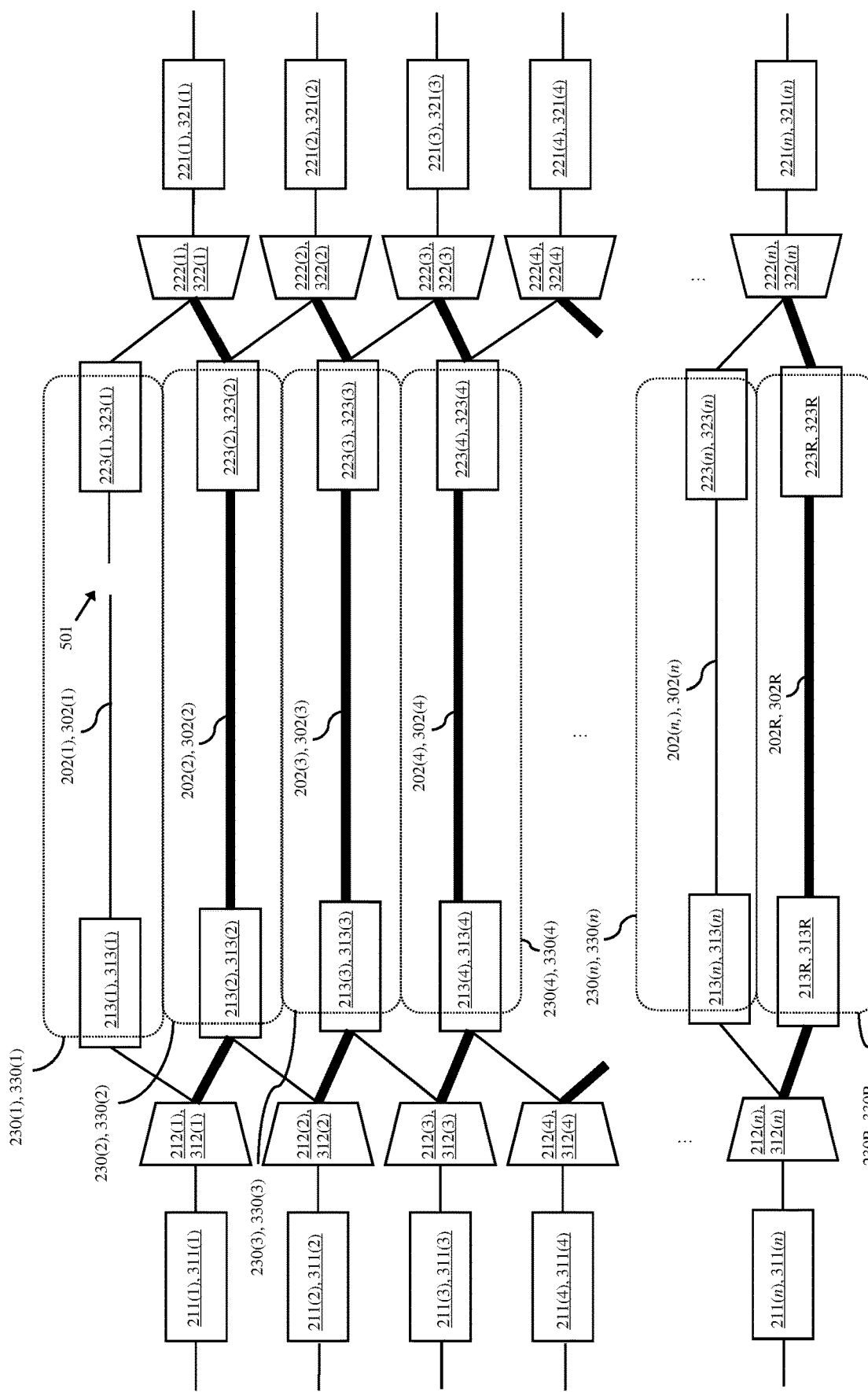

Consider the case as shown in FIG. 5 where the signal trace 202(1), 302(1) in the first chip-to-chip communication connection 230(1), 330(1) has a defect 501. The defect 501 could be, for example, a void, as illustrated, or some other defect that is detectable during test of the chip-mounting layer 201, 399 (e.g., during in-line testing, such as optical inspections, or during post-manufacture testing, electrical tests). In this case, during MCM assembly, control signals will be sent to the first multiplexors 212(1)-212(n), 312(1)-312(n) and to the second multiplexors 222(1)-222(n), 322(1)-322(n) so that the pairs of first and second interfaces are connected to their secondary chip-to-chip communication connections 230(2)-230R, 330(2)-330R, respectively, and the first chip-to-chip communication connection 230(1), 330(1) is bypassed.

Figure 6:
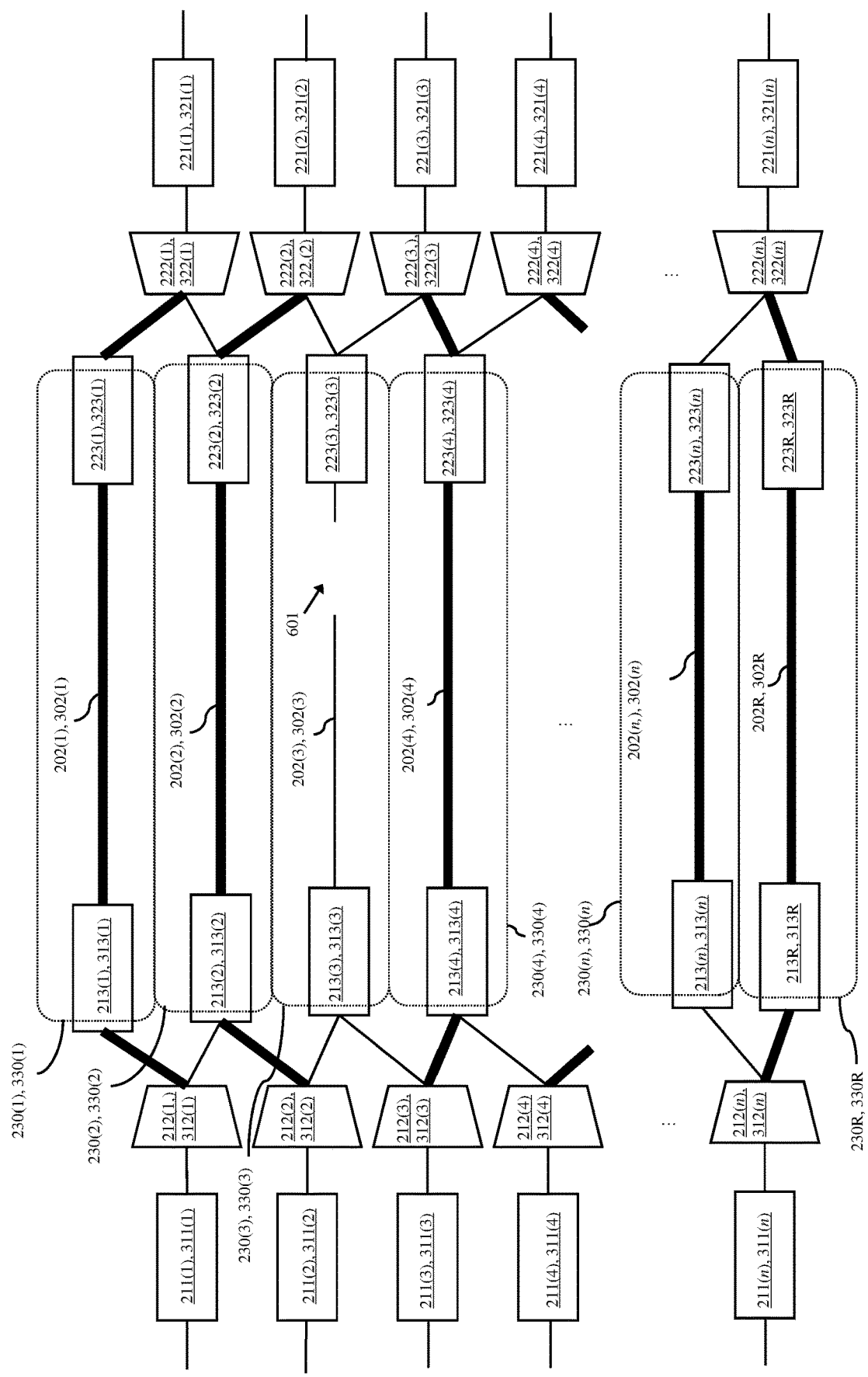

Consider the case as shown in FIG. 6 where another signal trace (e.g., the third signal trace 202(3), 302(3) in the third chip-to-chip communication connection 230(3), 330(3)) has a defect 601. Again, the defect 601 could be, for example, a void, as illustrated, or some other defect that is detectable during test of the chip-mounting layer 201, 399 (e.g., during in-line testing, such as optical inspections, or during post-manufacture testing, electrical tests). In this case, during MCM assembly, control signals can be sent to the first multiplexors 212(1)-212(n), 312(1)-312(n) and to the second multiplexors 222(1)-222(n), 322(1)-322(n) so that the pairs of first and second interfaces are connected to the chip-to-chip communication connections as follows: the first pair of first and second interfaces 211(1) and 221(1), 311(1) and 321(1) can be selectively connected by the first pair of first and second multiplexors 212(1) and 222(1), 312(1) and 322(1) to the first chip-to-chip communication connection 230(1), 330(1); the second pair of first and second interfaces 211(2) and 221(2), 311(2) and 321(2) can be selectively connected by the second pair of first and second multiplexors 212(2) and 222(2), 312(2) and 322(2) to the second chip-to-chip communication connection 230(2), 330(2); the third pair of first and second interfaces 211(3) and 221(3), 311(3) and 321(3) can be selectively connected by the third pair of first and second multiplexors 212(3) and 222(3), 312(3) and 322(3) to the fourth chip-to-chip communication connection 230(4), 330(4) (thereby bypassing the third chip-to-chip communication section with the defective signal trace); the fourth pair of first and second interfaces 211(4) and 221(4), 311(4) and 321(4) can be selectively connected by the fourth pair of first and second multiplexors 212(4) and 222(4), 312(4) and 322(4) to fifth chip-to-chip communication connection 230(4), 330(4); and so on with the last pair of first and second interfaces 211(n) and 221(n), 311(n) and 321(n) being selectively connected by the last pair of first and second multiplexors 212(n) and 222(n), 312(n) and 322(n) to the redundant chip-to-chip communication connection 230R, 330R (i.e., the extra chip-to-chip communication connection).

Thus, in the disclosed MCM embodiments can incorporate a chip-mounting layer (e.g., a module substrate 201 as in FIG. 2 or an interposer 399 as in FIG. 3) with defective signal traces (e.g., up to one per chip-to-chip communication section) and yield can be effectively improved.

As mentioned above, defective signal traces in the chip-mounting layer 201, 399 could be identified during testing of the chip-mounting layer 201, 399 (e.g., during in-line testing, such as optical inspections, or during post-manufacture testing, electrical tests). The chip-mounting layer 201, 399 can be shipped out with a spreadsheet or other document, which includes defect information that specifically maps out (i.e., identifies the specific locations of) the defective signal traces on the chip-mounting layer. Alternatively, the chip-mounting layer 201, 399 can be shipped out with a separate storage device, link, access code, etc. or other means for accessing an electronic spreadsheet or other electronic document, which includes defect information that specifically maps out (i.e., identifies the specific locations of) the defective signal traces on the chip-mounting layer. Alternatively, the chip-mounting layer 201, 399 can include a coded region 205, 305 that stores coded defect information, which specifically maps out (i.e., identifies the specific locations of) the defective signal traces on the chip-mounting layer. During MCM assembly, the coded defect information can be automatically read and processed (e.g., by an MCM assembly controller) to program the various on-chip multiplexors as needed to bypass the defective signal traces. The coded region 205, 305 could include a conventional barcode or matrix barcode applied to the surface of the chip-mounting layer 201, 399. Alternatively, the coded region 205, 305 could be a one-time programmable (OTP) non-volatile memory (NVM) device (e.g., an OTP NVM that employs fuses or anti-fuses to store data), which formed in the chip-mounting layer 201, 399. Alternatively, the coded region 205, 305 could be a relatively small chip (referred to herein as chiplet) mounted on a surface of the chip-mounting layer 201, 399.

Optionally, the defect information (e.g., on the spreadsheet or stored in the coded region 205, 305) can also flag defective signal traces that are deemed to be "critical" and "non-critical" given the MCM design. A critical defective signal trace could be, for example, a defective signal trace that if used would result in a fail of a communication connection that is deemed critical for MCM operation. A non-critical defective signal trace could be, for example, a defective signal trace that if used would result not result in a fail a communication connection that is deemed critical for MCM operation. In this case, the on-chip multiplexors could be controlled to ensure that at least the critical defective signal trace(s) are bypassed.

Figure 7:
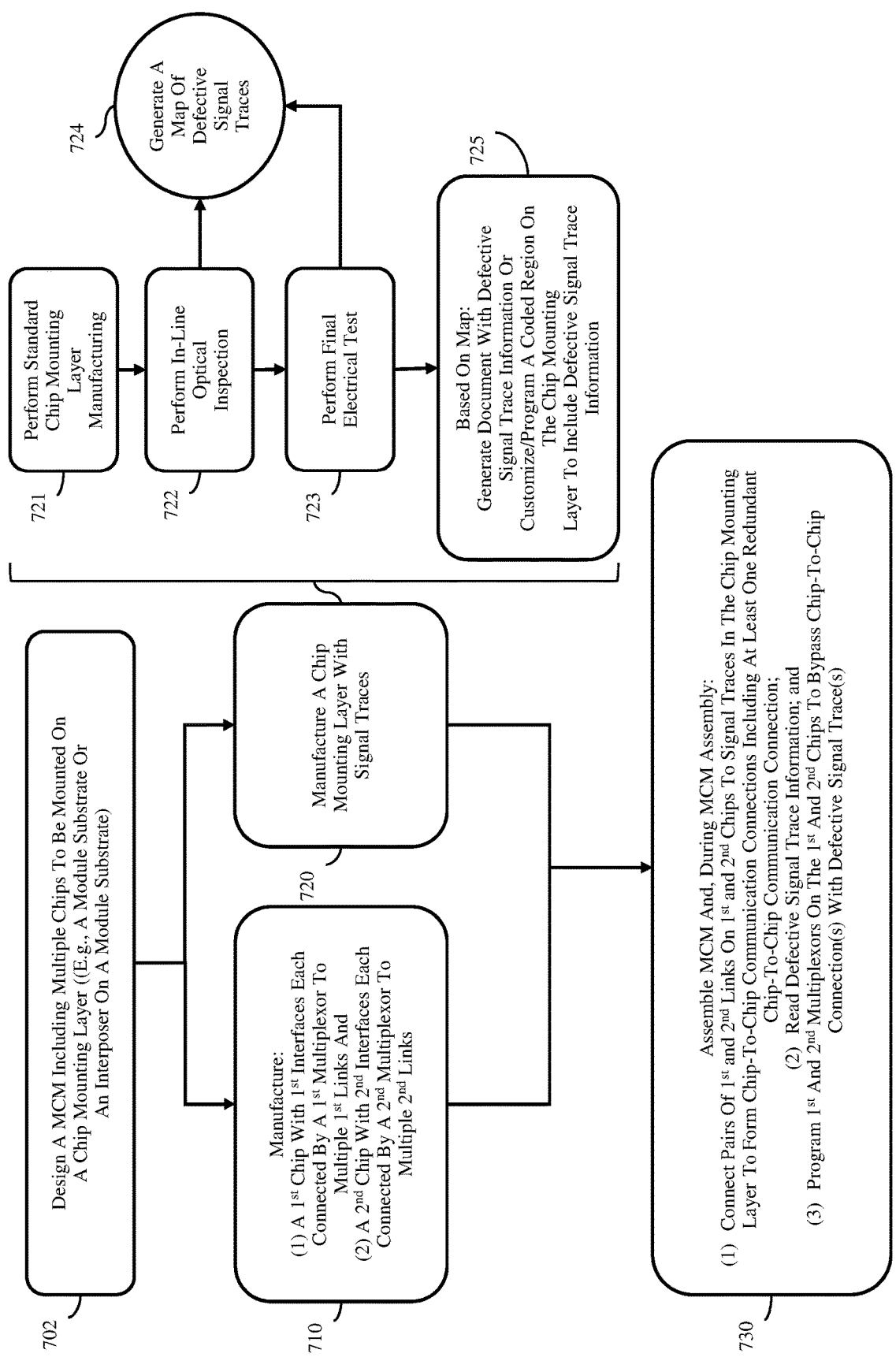
FIG. 7 is a flow diagram illustrating method embodiments for designing, manufacturing and assembling a MCM.

Referring to FIG. 7 in combination with the MCM 200 or 300 shown in FIG. 2 or FIG. 3, respectively, also disclosed herein are method embodiments for designing, manufacturing and assembling the above-described multi-chip modules (MCMs) 200, 300. Specifically, the method embodiments can include designing a MCM 200, 300 (see process step 702). The process of designing the MCM can include designing the multiple chips for the MCM, designing a module substrate for the MCM and, optionally, designing an interposer for stacking between the chips and the module substrate of the MCM. Those skilled in the art will recognize that designing of the various MCM components including the chips, the substrate and, optionally, the interposer can be an iterative process wherein design changes to one component may necessitate design changes to another. Furthermore, design changes to a printed circuit board (PCB) on which the MCM will be mounted may necessitate design changes to the various components of the MCM.

In any case, the MCM could be designed at process step 702 so that first and second chips 210 and 220 can be mounted directly onto the module substrate 201 (e.g., by C4 connections 203) (e.g., as in the MCM 200 shown in FIG. 2). As discussed above, a module substrate can be designed so that it provides mechanical strength for the MCM. For example, the module substrate could be designed as a laminate substrate with multiple layers that provide rigidity. A module substrate can also be designed to include ball grid arrays (BGAs) that will enable mounting of the module substrate (and thereby the MCM) onto a printed circuit board (PCB) and that will further provide the electrical connections between the module substrate and the PCB (e.g., for power supply, signal transmission, etc.) as well as isolation around those electrical connections. A module substrate can also be designed to include vias and wires (e.g., power traces, signal traces, etc.) routed to provide both chip-to-chip electrical connections and chip-to-PCB electrical connections. In other word, the MCM could be designed at process step 702 so that the module substrate 201 is the chip-mounting layer. Alternatively, the MCM could be designed at process step 702 so that chips 31-, 320 are mounted onto an interposer 399 (e.g., by C4 connections 303), so that the interposer 399 is mounted on the module substrate 301 (e.g., by C4 connections 304) (e.g., as in the MCM 300 shown in FIG. 3). As discussed above, the interposer 399 can include vias and wiring (e.g., power traces, signal traces, etc.) to provide chip-to-chip electrical connections and chip-to-module substrate electrical connections. In other word, the MCM could be designed at process step 702 so that the interposer 399 is the chip-mounting layer.

The chips and chip-mounting layer can be designed at process step 702 so that the MCM 20, 300 will have some number (x) of chip-to-chip communication section(s) 250(1)-250(x), 350(1)-350(x). For purposes of illustration, three chip-to-chip communication sections are shown in the Figures. Alternatively, the number (x) of chip-to-chip communication sections could be one, two, four or more chip-to-chip communication sections. The chips and chip-mounting layer can further be designed at process step 702 so that each chip-to-chip communication section 250(1)-250(x), 350(1)-350(x) includes: some number (n) of first links 213(1)-213(n), 313(1)-313(n) plus one redundant first link 213R, 313R on the first chip 210, 310; the same number (n) of second links 223(1)-223(n), 323(1)-323(n) plus one redundant second link 223R, 323R on the second chip 220, 320; and the same number (n) of signal traces 202(1)-202(n), 302(1)-302(n) plus one redundant signal trace 202R, 302R in the chip-mounting layer 201, 399 extending between chip-mounting areas.

The chips can further be designed at process step 702 so that each chip-to-chip communication section 250(1)-250(x), 350(1)-350(x) includes n first interfaces 211(1)-211(n), 311(1)-311(n), which are on the first chip 210, 310, and n second interfaces 221(1)-221(n), 321(1)-321(n), which are on the second chip 220, 320 and which are paired with the first interfaces 211(1)-211(n), 311(1)-311(n). The first interfaces 211(1)-211(n), 311(1)-311(n) and the second interfaces 221(1)-221(n), 321(1)-321(n) can be, for example, serial/deserializer (ser/des) functional blocks. Alternatively, the first interfaces 211(1)-211(n), 311(1)-311(n) and the second interfaces 221(1)-221(n), 321(1)-321(n) could be any other suitable communication interface.

The chips can further be designed at process step 702 so that each chip-to-chip communication section 250(1)-250(x), 350(1)-350(x) includes n first multiplexors 212(1)-212(n), 312(1)-312(n), which are on the first chip 210, 310, and n second multiplexors 222(1)-222(n), 322(1)-322(n), which are on the second chip 220, 320 and which are paired with the first multiplexors 212(1)-212(n), 312(1)-312(n). The first chip 210, 310 can specifically be designed so that each first multiplexor 212(1)-212(n), 312(1)-312(n) is connected between one first interface 211(1)-211(n), 311(1)-311(n) and multiple first links (e.g., two of the first links including a primary first link and a secondary first link for that interface), as illustrated and discussed above with regard to the MCM structure. Similarly, the second chip 220, 320 can be designed so that each second multiplexor 222(1)-222(n), 322(1)-322(n) is connected between one second interface 221(1)-221(n), 321(1)-321(n) and multiple second links (e.g., two of the second links including a primary second link and a secondary second link for that interface), as illustrated and discussed above with regard to the structure.

Optionally, the chip-mounting layer 201, 399 can further be designed to have a coded region 205, 305. The design for the coded region 205, 305 could simply be an area on the surface of the chip-mounting layer on which a barcode will be placed post-manufacture. Alternatively, the coded region 205, 305 could a one-time programmable (OTP) non-volatile memory (NVM) (e.g., a fuse or anti-fuse based memory), which could be programmed post-manufacture. Alternatively, the coded region 205, 305 could a small chip (referred to herein as a chiplet), which could be programmed post-manufacture.

The method embodiments can further include, following designing of the first and second chips 210 and 220, 310 and 320, manufacturing the first and second chips 210 and 220, 310 and 320, as designed (see process step 710). The manufacturing process for the chips can be a conventional chip manufacturing process.

Additionally, the method embodiments can, following designing of the chip-mounting layer 201, 399, manufacturing the chip-mounting layer 201, 399, as designed (see process step 720). The manufacturing process for the chip-mounting layer can be a conventional chip-mounting layer manufacturing process, which includes routing for wires and vias (including signal traces) (see process step 721). During this manufacturing process, in-line testing (e.g., automated optical inspections (AOI) or other inspections) can be performed on the chip-mounting layer 201, 399 in order to detect defects in any of the signal traces (see process step 722). Following manufacturing of the chip-mounting layer 201, 399, electrical testing can also be performed on the chip-mounting layer 201, 399 in order to detect defect in any of the signal traces (see process step 723). Defects that are in signal traces and detected during in-line or post-manufacture testing could be, for example, voids or any other detectable defect that could impact performance (e.g., shorts to other wires, traces, etc.). Techniques for performing in-line optical inspections and post-manufacture electrical tests to identify defects in wiring (e.g., in signal or other traces) are well known in the art. Thus, the details of such techniques have been omitted from this specification in order to allow the reader to focus on the salient aspect of the disclosed method embodiments.

In any case, the results of testing at process steps 722-723 can be used to generate a report of defect information including, for example, a map that identifies defective signal traces (see process step 724). The report can be in the form of a spreadsheet or other document. For embodiments where the design of the chip-mounting layer 201, 399 also includes a coded region 205, 305, this defect information could also be added to (i.e., stored in) the coded region 205, 305 (see process step 725). For example, storing the defect information in the coded region 205, 305 could, for example, be accomplished by adhering, printing or otherwise forming, on the surface of the chip-mounting layer in the coded region, a conventional or matrix barcode with the defect information encoded therein. Alternatively, if the chip-mounting layer was designed and manufactured so as to include an OTP NVM or a chiplet in the coded region 205, 305, the OTP NVM or the chiplet could be programmed to include the defective signal trace information.

Optionally, the defect information (e.g., on the spreadsheet or stored in the coded region 205, 305) can also flag defective signal traces that are deemed to be "critical" and "non-critical" given the MCM design. A critical defective signal trace could be, for example, a defective signal trace that if used would result in a fail of a communication connection that is deemed critical for MCM operation. A non-critical defective signal trace could be, for example, a defective signal trace that if used would result not result in a fail a communication connection that is deemed critical for MCM operation.

The MCM 200, 300 can then be assembled (see process step 730). That is, the first and second chips 210 and 220, 310 and 320 can be mounted in the chip-mounting areas on the surface of the chip-mounting layer 201, 399 (e.g., using C4 connections 203, 303). If the chip-mounting layer 399 is an interposer, the chip-mounting layer 399 can further be mounted onto the module substrate 301 (e.g., see the embodiment of the MCM 300 shown in FIG. 3). As the first chip 210, 310 and the second chip 220, 320 are mounted onto the chip-mounting layer 201, 399, in each chip-to-chip communication section 250(1)-250(x), 350(1)-350(x), the n signal traces 202(1)-202(n), 302(1)-302(n) and one redundant signal trace 202R, 302R can be electrically connected at one end to then first links 213(1)-213(n), 313(1)-313(n) and one redundant first link 213R, 313R on the first chip 210, 310 and at the other end to the n second links 223(1)-223(n), 323(1)-323(n) and one redundant second link 223R, 323R on the second chip 220, 320, thereby forming n chip-to-chip communication connections 230(1)-230(n), 330(1)-330(n) plus one redundant chip-to-chip communication connection 230R, 330R.

During assembly of the MCM at process step 730, the defect information previously determined at process step 724 can be read in order to determine which, if any, of the chip-to-chip communication connections 230(1)-230(n), 330(1)-330(n) in each chip-to-chip communication section 250(1)-250(n), 350(1)-350(n) contain defective signal traces. It should be understood that, if the chip-mounting layer 201, 399 includes a coded region 205, 305, this defect information could be automatically read and processed (e.g., by an MCM assembly controller). The on-chip multiplexors can then be programmed as needed to bypass those connections with defective signal traces. That is, in each chip-to-chip communication section 250(1)-250(x), 350(1)-350(x), the pairs of first and second multiplexors 212(1)-212(n), 312(1)-312(n) can be used to selectively connect each corresponding pair of first and second interfaces 211(1)-211(n), 311(1)-311(n) to one of two chip-to-chip communication connections in a manner that bypasses a chip-to-chip communication connection that contains defective signal trace (if present). For example, see the detailed discussion of FIGS. 4-6 above. Thus, in the disclosed method embodiments, even though a chip-mounting layer (e.g., a module substrate 201 as in FIG. 2 or an interposer 399 as in FIG. 3) is determined at process step 724 to have defective signal traces (e.g., up to one per chip-to-chip communication section), it can still be employed at process step 730 when assembling a MCM 200, 300 as opposed to being discarded. Optionally, if the defective information indicates "critical" and "non-critical" defective signal traces, the on-chip multiplexors could also be controlled as described above to ensure that at least the critical defective signal trace(s) are bypassed. Thus, yield can be effectively improved.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-chip module comprising:
   a chip-mounting layer comprising signal traces; and
   at least a first chip and a second chip mounted on a surface of the chip-mounting layer,
   wherein the first chip comprises first links and the second chip comprises second links,
   wherein each signal trace is electrically connected to a first link on the first chip and to a second link on the second chip to form a chip-to-chip communication connection,
   wherein the first chip further comprises first interfaces and first multiplexors with each first multiplexor being connected between one first interface and multiple first links and the second chip further comprises second interfaces and second multiplexors with each second multiplexor being connected between one second interface and multiple second links, and
   wherein each pair of first and second interfaces is selectively connectable by a corresponding pair of first and second multiplexors to one of multiple chip-to-chip communication connections.

2. The multi-chip module of claim 1, further comprising at least one redundant chip-to-chip communication connection, wherein the first multiplexors, the second multiplexors, and the at least one redundant chip-to-chip communication connection enable at least one chip-to-chip communication connection with a defective signal trace to be bypassed.

3. The multi-chip module of claim 1, further comprising multiple chip-to-chip communication sections, each section comprising:
   a first number of pairs of first and second interfaces and of pairs of first and second multiplexors; and
   a second number of pairs of first and second links, of signal traces and of chip-to-chip communication connections, wherein the second number is greater than the first number by one so that the section comprises one redundant chip-to chip communication connection, and
   wherein the first multiplexors, the second multiplexors and the one redundant chip-to chip communication connection in the section enable one chip-to-chip communication connection within the section and having a defective signal trace to be bypassed.

4. The multi-chip module of claim 1, wherein the chip-mounting layer further comprises a coded region identifying any detected defective signal traces within the chip-mounting layer and wherein the coded region is readable during module assembly to program the first multiplexors and the second multiplexors.

5. The multi-chip module of claim 4, wherein the coded region comprises a bar code region.

6. The multi-chip module of claim 4, wherein the coded region comprises a one-time programmable non-volatile memory comprising any of fuses and anti-fuses.

7. The multi-chip module of claim 4, wherein the coded region comprises a chiplet.

8. The multi-chip module of claim 1, wherein the chip-mounting layer comprises any of a substrate and an interposer mounted on a substrate.

9. The multi-chip module of claim 1, wherein the first interfaces and the second interfaces comprise serializer/deserializer function blocks and the first links and the second links comprise input/output ports.

10. A multi-chip module comprising:
a substrate comprising signal traces, wherein a size of the substrate is at least 5625 mm$^2$; and
multiple chips mounted on the substrate and comprising at least a first chip and a second chip,
wherein a size of at least one of the chips is above 400 mm$^2$,
wherein the first chip comprises first links and the second chip comprises second links,
wherein each signal trace is electrically connected to a first link on the first chip and to a second link on the second chip to form a chip-to-chip communication connection,
wherein the first chip further comprises first interfaces and first multiplexors with each first multiplexor being connected between one first interface and multiple first links and the second chip further comprises second interfaces and second multiplexors with each second multiplexor being connected between one second interface and multiple second links, and
wherein each pair of first and second interfaces is selectively connectable by a pair of corresponding first and second multiplexors to one of multiple chip-to-chip communication connections.

11. The multi-chip module of claim 10, further comprising at least one redundant chip-to-chip communication connection, wherein the first multiplexors, the second multiplexors, and the at least one redundant chip-to-chip communication connection enable at least one chip-to-chip communication connection with a defective signal trace to be bypassed.

12. The multi-chip module of claim 10, further comprising multiple chip-to-chip communication sections, each section comprising:
a first number of pairs of first and second interfaces and of pairs of first and second multiplexors; and
a second number of pairs of first and second links, of signal traces and of chip-to-chip communication connections, wherein the second number is greater than the first number by one so that the section comprises one redundant chip-to chip communication connection, and
wherein the first multiplexors, the second multiplexors and the one redundant chip-to chip communication connection in the section enable one chip-to-chip communication connection within the section and having a defective signal trace to be bypassed.

13. The multi-chip module of claim 10, wherein the substrate further comprises a coded region identifying any previously detected defective signal traces within a chip-mounting layer and wherein the coded region is readable during module assembly to program the first multiplexors and the second multiplexors.

14. The multi-chip module of claim 10, wherein the first interfaces and the second interfaces comprise serializer/deserializer function blocks and the first links and the second links comprise input/output ports.

15. A method comprising:
mounting a first chip and a second chip on a surface of a chip-mounting layer in designated chip-mounting areas,
wherein the chip-mounting layer comprises signal traces between the designated chip-mounting areas,
wherein the first chip comprises first interfaces, first links, and first multiplexors with each first multiplexor being connected between one first interface and multiple first links,
wherein the second chip comprises second interfaces, second links, and second multiplexors with each second multiplexor being connected between one second interface and multiple second links, and
wherein, during the mounting, each signal trace is electrically connected to a first link on the first chip and to a second link on the second chip to form chip-to-chip communication connections; and
using each pair of first and second multiplexors to connect a corresponding pair of first and second interfaces to a selected one of at least two of the chip-to-chip communication connections.

16. The method of claim 15,
wherein at least one of the chip-to-chip communication connections is a redundant chip-to-chip communication connection, and
wherein the method further comprises:
before the mounting, reading defect information identifying defective signal traces within the chip-mounting layer; and
given the redundant chip-to-chip communication connection and based on the defect information, using the first multiplexors and the second multiplexors to bypass at least one chip-to-chip communication connection with a defective signal trace.

17. The method of claim 16, further comprising:
during manufacturing of the chip-mounting layer, performing optical inspections; and
following manufacturing of the chip-mounting layer, performing electrical tests, wherein results of the optical inspections and the electrical tests are used to identify the defective signal traces.

18. The method of claim 16,
wherein the reading of the defect information comprises automatically reading a coded region that is on the chip-mounting layer and that identifies any previously detected defective signal traces within the chip-mounting layer, and
wherein the coded region comprises any of a bar code, a one-time programmable non-volatile memory comprising any of fuses and anti-fuse, and a chiplet in the coded region.

19. The method of claim 15, wherein the chip-mounting layer comprises any of a substrate and an interposer mounted on a substrate.

20. The method of claim 15, wherein the first interfaces and the second interfaces comprise serializer/deserializer function blocks and the first links and the second links comprise input/output ports.

\* \* \* \* \*